(12) United States Patent
Zhang

(10) Patent No.: US 9,354,294 B2
(45) Date of Patent: May 31, 2016

(54) SOLAR TRACKING SYSTEM IN REAL TIME INCLUDING A LIGHT-RESISTANT BOX WITH A LOOPHOLE AT A TOP SURFACE BEING SMALLER THAN EACH CONVEX LENS IN A CONEX LENS PLANE ARRAY LOCATED WITHIN THE LIGHT-RESISTANT BOX

(71) Applicant: Hefei Zhang, Shanghai (CN)

(72) Inventor: Hefei Zhang, Shanghai (CN)

(73) Assignee: Junjun Fu, Yiwu, Zhejiang (CN)

( * ) Notice: Subject to any disclaimer, the term of this patent is extended or adjusted under 35 U.S.C. 154(b) by 0 days.

(21) Appl. No.: 13/993,243

(22) PCT Filed: Sep. 22, 2012

(86) PCT No.: PCT/CN2012/081789
§ 371 (c)(1),
(2) Date: Jun. 11, 2013

(87) PCT Pub. No.: WO2013/170563
PCT Pub. Date: Nov. 21, 2013

(65) Prior Publication Data
US 2015/0076319 A1   Mar. 19, 2015

(30) Foreign Application Priority Data
May 17, 2012   (CN) .......................... 2012 1 0153846

(51) Int. Cl.
G01J 1/20 (2006.01)
G01S 3/786 (2006.01)
H01L 31/054 (2014.01)
F24J 2/38 (2014.01)

(52) U.S. Cl.
CPC ................ *G01S 3/7861* (2013.01); *F24J 2/38* (2013.01); *H01L 31/0543* (2014.12); *H02S 20/32* (2014.12); *Y02E 10/52* (2013.01)

(58) Field of Classification Search
CPC ....... Y02E 10/52; Y02E 10/47; G01S 3/7861; F24J 2/38; F24J 2/5403; F24J 2/5417; H02S 20/32; H01L 31/0543
USPC .......... 250/203.1, 203.4, 203.3, 206.1, 206.2, 250/216, 239, 221; 126/572, 573, 576, 574; 356/4.01, 3.13, 152.1, 140, 141.2, 356/141.5
See application file for complete search history.

(56) References Cited

U.S. PATENT DOCUMENTS 8,973,570 B2 * 3/2015 Stavrou et al. ................ 126/573

FOREIGN PATENT DOCUMENTS

| CN | 101662241 A | * | 3/2010 |
| CN | 201876732 U | * | 6/2011 |

* cited by examiner

*Primary Examiner* — Que T Le
*Assistant Examiner* — Jennifer Bennett

(57) ABSTRACT

A real-time solar tracking system includes: a microcontroller, a light-resistant box, a motor for changing a direction angle of a solar collection board, and a diver for controlling operating condition of the motor. The light-resistant box has a loophole disposed at a top surface of the light-resistant box, a convex lens plane array is disposed parallel to a bottom surface of the light-resistant box, and a photosensitive element array is disposed at a bottom of the light-resistant box. The microcontroller is used for calculating a solar direction angle according to a solar direction angle signal obtained from the photosensitive element array, and sending directions to the driver. With advantages of high detecting accuracy, high degree of automation and intelligence, well environmental adaptability, high reliability, low cost, the present invention is particularly suitable for solar power system.

10 Claims, 4 Drawing Sheets

SOLAR TRACKING SYSTEM IN REAL TIME INCLUDING A LIGHT-RESISTANT BOX WITH A LOOPHOLE AT A TOP SURFACE BEING SMALLER THAN EACH CONVEX LENS IN A CONEX LENS PLANE ARRAY LOCATED WITHIN THE LIGHT-RESISTANT BOX

BACKGROUND OF THE PRESENT INVENTION

1. Field of Invention

The present invention relates to a real-time solar tracking system, and more particularly to a real-time solar tracking system for a solar power system.

2. Description of Related Arts

Energy is an important material basis for existence and development of human society. With the rapid development of the economy, our demand for energy has being increased greatly, and the contradiction between the supply and demand of energy has been especially serious. The Chinese government encourages the development and utilization of solar power, wind power, hydroelectric power and other new energy sources as well as advocates energy conservation. Solar power is a clean and low-polluting new energy, but the utilization rate of solar power is fairly low at present. The highest photoelectric conversion efficiency of the currently widely-used photovoltaic device is only about 16%, and the low photoelectric conversion efficiency results in a high power generation cost which is one of the major reasons that restrict the development of solar power technology. It is well known that the photoelectric conversion efficiency maximizes when sun light are perpendicular to the sunlight-collecting device. Therefore, if the sun rays remain perpendicular to the sunray-collecting device, the solar power device will maintain the best solar utilization state to improve the utilization rate of solar power. In the prior art, a solar tracker is currently implemented mainly by using the following methods of constant voltage judgment, gradually reducing the distance between the initial state and target state, admittance differential or methods based on two-dimensional PSD. These methods mentioned above commonly have the shortcomings of large error, sampling results oscillating at the maximum power point, higher prices, and etc. At present, most of the solar tracking systems have the problem of complexity, low reliability and stability, high costs for operation and maintenance, poor environment adaptability, low degree of automation, and etc.

SUMMARY OF THE PRESENT INVENTION

In order to avoid the shortcomings mentioned above in the prior art, the present invention provides a real-time solar tracking system for reducing errors and costs of the conventional solar tracking system, simplifying the conventional solar tracking system, improving automation degree and environment adaptability of the conventional solar tracking system.

In order to solve the technical problems, the present invention adopts technical proposals as follows.

A real-time solar tracking system comprises:

a light-resistant box having a loophole provided at a top surface thereof, wherein the light-resistant box comprises a convex lens plane array therein, which is parallel to a bottom surface of the light-resistant box, and a photosensitive element array provided at a bottom of the light-resistant box;

a microcontroller, connected with the photosensitive element array for obtaining a solar direction angle signal from the photosensitive element array and calculating solar direction angles;

a driver, connected with the microcontroller through a data wire, for receiving instructions from the microcontroller;

a motor, connected with the driver through a conducting wire, and driven by the driver; and a solar collection board, connected with the motor mechanically, adjusting a direction thereof under a driving of the motor and collecting solar.

The real-time solar tracking system of the present invention has the following features.

The light-resistant box is a cuboid-shaped box, wherein the loophole disposed at a center of the top surface of the light-resistant box.

The light-resistant box is a cylindrical box, wherein the top of the light-resistant box is a conical surface and the loophole is disposed at a vertex of the conical surface, wherein an angle between a generatrix of the conical surface and an axis of the conical surface is A, and 80°≤A≤85°.

The loophole is sealed with a glass sheet.

A horizontal section of the convex lenses is hexagonal.

The driver is a uln2003 Darlington array.

The microcontroller is a mega16 singlechip.

A plane of the convex lens plane array is parallel to the bottom surface of the light-resistant box, and a distance between the plane of the convex lens plane array and the bottom surface of the light-resistant box is ⅔ of a total height of the light-resistant box.

Compared with prior art, the present invention has the following beneficial effects.

According to the principle of sundial, the present invention disposes the loophole at the sealed light-resistant box to lead sunlight into the sealed light-resistant box, uses convex lenses to gather sunlight, and the gathered sunlight is received by the photosensitive elements. Therefore, the present invention is able to avoid using external light to affect the photosensitive elements. With the photosensitive elements less vulnerable to influence of outside scattered light, the detection accuracy of the sunlight angle is improved and the error of solar tracking is reduced. With the microcontroller controlling the driver and the driver driving the motor, the automation and intelligence of the real-time solar tracking system is improved. The solar direction angle, with an accuracy of 0.01°, is calculated according to trigonometric and inverse trigonometric function. The top of the light-resistant box is a conical surface. The loophole is sealed with the glass sheet to avoid rain entering the light-resistant box, so that the environment adaptation ability of the real-time solar tracking system is improved. The horizontal section of the convex lenses is hexagonal, which makes each convex lens be able to connect with six adjacent convex lenses. So the accuracy of determining the light spot position is enhanced for improving the accuracy of calculating the sunlight angle and reducing the error of the system. In addition, the uses are capable of adjusting the detection resolution of the system by adjusting the convex lenses size, and the adjustability of the system is well. Compared with similar products, the mega16 singlechip and the uln2003 Darlington array are at lower prices, and thus helpful to reduce the cost of the system. The uln2003 Darlington array is a kind of Darlington array for high voltage and current. And the uln2003 Darlington array has the features of high current gain, high working voltage, wide range of working temperature, strong loading capability, and etc. Therefore, the uln2003 Darlington array is able to adapt for a variety of systems that require high-power driver, and the reliability of the system is improved. The present invention disposes the loophole at the sealed light-resistant box, and disposes the convex lenses in the sealed light-resistant box to gather sunlight. The present invention, with simple structure, easy implementation and lower costs, also has advantages of high detecting accuracy, high degree of automation and intelligence, well environmental adaptability, high reliability, low cost, and etc.

The invention is particularly suitable for solar power system, and also available for equipments that use solar power such as solar water heater.

BRIEF DESCRIPTION OF THE DRAWINGS

The number of elements in FIG. 1, FIG. 2, FIG. 3, FIG. 4 and FIG. 5 is as follows: 1-light-resistant box, 2-loophole, 3-convex lenses, 4-photosensitive elements, 5-sunlight, 6-microcontroller, 7-diver, 8-motor, 9-solar collection board.

Figure 1:
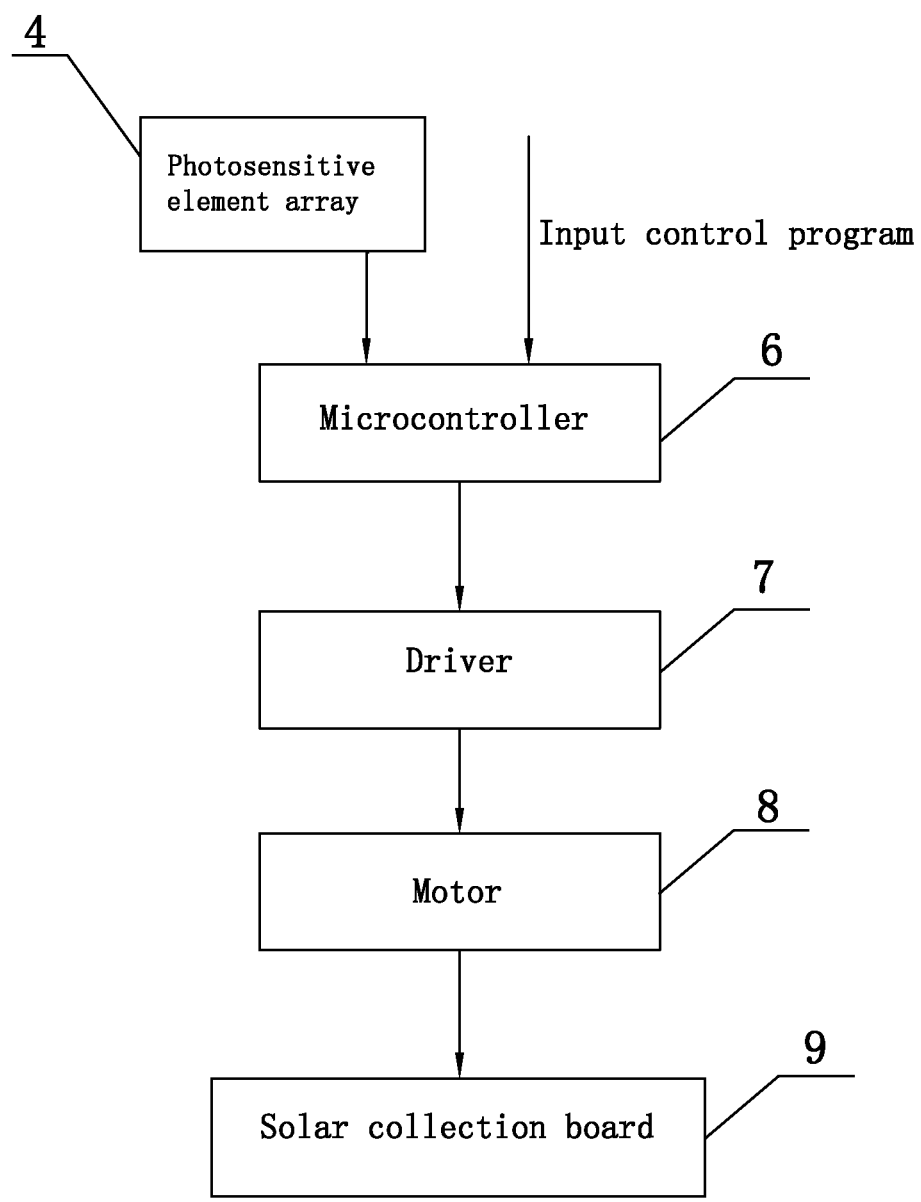
FIG. 1 is a structure diagram of a real-time solar tracking system according to a preferred embodiment of the present invention.
Figure 2:
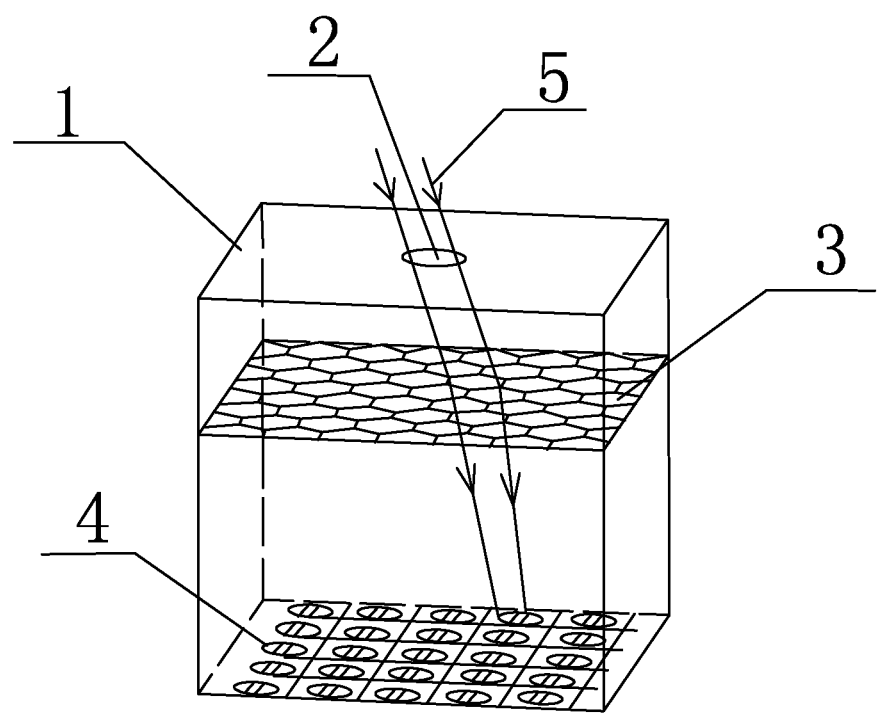
FIG. 2 is a sketch view of a structure of a sealed light-resistant box according to a preferred embodiment of the present invention.

Further description of the present invention is made as follows according to the embodiment and diagrams attached.

DETAILED DESCRIPTION OF THE PREFERRED EMBODIMENT

Referring to FIG. 1, FIG. 2, FIG. 3, FIG. 4 and FIG. 5, a real-time solar tracking system comprises:

a light-resistant box 1, having a loophole 2 provided at a top surface thereof, wherein the light-resistant box 1 comprises a convex lens plane array 3 therein, which is parallel to the bottom surface of the light-resistant box 1, and a photosensitive element array 4 provided at a bottom of the light-resistant box 1;

a microcontroller 6, connected with the photosensitive element array 4 for obtaining solar direction angle signals from the photosensitive element array 4 and calculating solar direction angles;

a driver 7, connected with the microcontroller 6 through a data wire, for receiving instructions from the microcontroller 6;

a motor 8, connected with the driver through a conducting wire, and driven by the driver 7; and a solar collection board 9, connected with the motor 8 mechanically, adjusting a direction thereof under a driving of the motor 8 and collecting solar.

The light-resistant box 1 is a cuboid-shaped box, wherein the loophole 2 is disposed in a center of the top surface of the light-resistant box 1, the light-resistant box 1 is a cylindrical box, wherein a top of the light-resistant box 1 is a conical surface and the loophole 2 is disposed at a vertex of the conical surface, wherein an angle between a generatrix of the conical surface and an axis of the conical surface is A, and $80° \leq A \leq 85°$, the loophole 2 is sealed with a glass sheet in order to avoid rain and dust entering the light-resistant box 1, the microcontroller 6 is preferably embodied as a mega16 singlechip, the driver 7 is preferably embodied as an uln2003 Darlington array. A plane of the convex lens 3 plane array is parallel to the bottom surface of the light-resistant box 1, and a distance between the plane of the convex lens plane array 3 and the bottom surface of the light-resistant box 1 is $\frac{2}{3}$ the total height of the light-resistant box 1. A horizontal section of the convex lenses is hexagonal.

The connections between the seamless hexagonal convex lenses are seamless to form a tight convex lens plane array 3. The photosensitive elements are disposed at the bottom of the light-resistant box 1. A position of each photosensitive element is determinate, and a distance between the photosensitive elements and a center point of the light-resistant box 1 bottom is fixed too Sunlight 5 passes through the loophole 2 into the light-resistant box 1 to be gathered and forms a gathered light spot which irradiates the photosensitive elements. The irradiated photosensitive elements generate electrical signals and input the electrical signals to the microcontroller 6. According to the position of the photosensitive elements in the array, the microcontroller 6 calculates the sunlight angle using presupposed formula. An initial state of the solar collection board 9 is set in the microcontroller 6. The initial state may be set that the solar collection board 9 is southward or eastward, and the angle between the solar collection board 9 and the horizontal plane is 45°. According to the initial state and a real-time azimuth calculated, the microcontroller 6 calculates control parameter, generates corresponding control signal and transmits the control signal to the driver 7. The driver 7 drives the motor 8 to operate to change the direction angle of the solar collection board 9 and make the sunlight 5 perpendicular to the solar collection board 9. So the purpose of maximizing the utilization of solar energy is achieved.

The microcontroller 6 is installed with a control program that is able to set working hours of the system, for example 7:00-19:00. In the set working hours, the system first initializes the position and determines the adjust reference. For example, the initial reference state is that the solar collection board 9 is eastward, and the angle between the solar collection board 9 and the horizontal plane is 45°. According to the reference state and the calculated sun azimuth, the motor 8 adjusts the solar collection board 9. After adjusting, the position parameter of system is saved into a storage of the microcontroller 6. Afterwards, another adjustment is made according to the position parameter of the system and the calculated sun azimuth. When the evening comes, the control program will shut down the system according to the set working hours. In cloudy or dull weather, as no light spot appears on the photosensitive elements, the system will be kept in the initial state.

Figure 3:
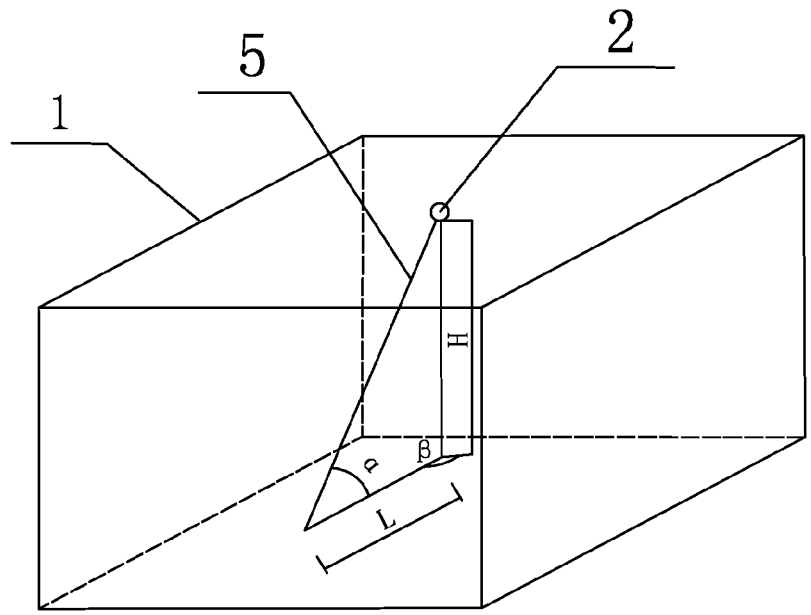
FIG. 3 is a sketch view of a real-time solar tracking system according to a preferred embodiment of the present invention, illustrating calculation of a sunlight angle.
Figure 4:
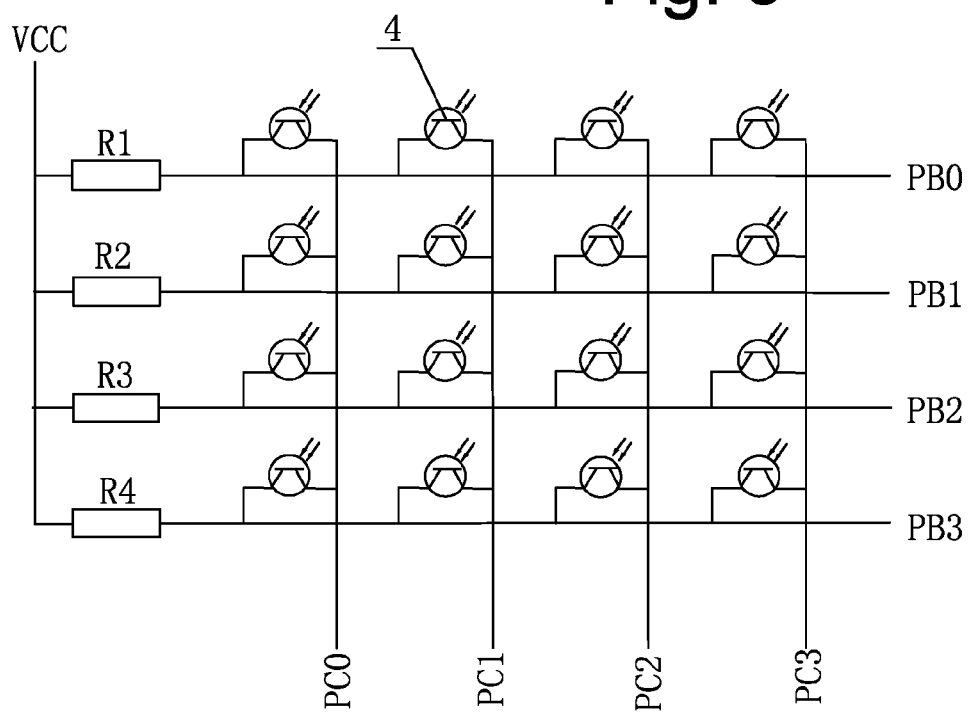
FIG. 4 is a diagram of connection between photosensitive elements and a microcontroller according to a preferred embodiment of the present invention.
Figure 5:
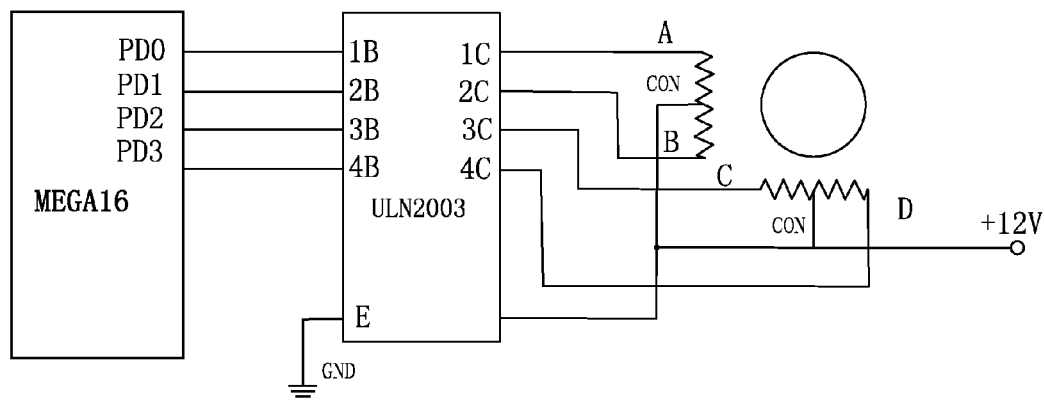
FIG. 5 is a driving schematic diagram of a motor of the real-time solar tracking system according to a preferred embodiment of the present invention.

In FIG. 3, $\alpha$ is a included angle between the sunlight 5 and the horizontal plane, and $\beta$ is a included angle between the horizontal projection of the sunlight 5 and the preset east or south direction. According to trigonometric and inverse trigonometric function, the $\alpha$ and $\beta$ are calculated to obtain the control parameter and generate corresponding the control signal. In FIG. 4, R1~R4 are resistors, PB0~PB3 and PC0~PC3 are input ports of the mega16 singlechip. FIG. 5 is a schematic diagram of driving of the motor 8, wherein the mega16 singlechip is connected to the uln2003 Darlington array via line interfaces, and output ports of the uln2003 Darlington array are connected with the motor 8. PD0~PD3 are output ports of the mega16 singlechip, 1B~3B are input ports of the uln2003 Darlington array, and 1C~3C are output ports of the uln2003 Darlington array.

According to the principle of sundial, the present invention disposes the loophole 2 at the sealed light-resistant box 2 to lead sunlight 5 into the sealed light-resistant box 1, uses convex lenses to gather sunlight 5, and the gathered sunlight 5 is received by the photosensitive elements. Therefore, the present invention is able to avoid using external light to affect the photosensitive elements. With the photosensitive elements less vulnerable to influence of outside scattered light, the detection accuracy of the sunlight angle is improved and the error of solar tracking is reduced. With the microcontroller 6 controlling the driver 7 and the driver 7 driving the motor 8, the automation and intelligence of the real-time solar tracking system is improved. The solar direction angle, with an accuracy of 0.01°, is calculated according to trigonometric and inverse trigonometric function. The top of the light-resistant box 1 is a conical surface. The loophole 2 is sealed with the glass sheet to avoid rain entering the light-resistant box 1, so that the environment adaptation ability of the real-time solar tracking system is improved. The horizontal section of the convex lenses is hexagonal, which makes each convex lens be able to connect with six adjacent convex lenses. So the accuracy of determining the light spot position is enhanced for improving the accuracy of calculating the sunlight angle and reducing the error of the system. In addition, the uses are capable of adjusting the detection resolution of the system by adjusting the convex lenses size, and the adjustability of the system is well. Compared with similar products, the mega16 singlechip and the uln2003 Darlington array are at lower prices, and thus helpful to reduce the cost of the system. The uln2003 Darlington array is a kind of Darlington array for high voltage and current. And the uln2003 Darlington array has the features of high current gain, high working voltage, wide range of working temperature, strong loading capability, and etc. Therefore, the uln2003 Darlington array is able to adapt for a variety of systems that require high-power driver, and the reliability of the system is improved. The present invention disposes the loophole 2 at the sealed light-resistant box 1, and disposes the convex lenses in the sealed light-resistant box 1 to gather sunlight 5. The present invention, with simple structure, easy implementation and lower costs, also has advantages of high detecting accuracy, high degree of automation and intelligence, well environmental adaptability, high reliability, low cost, and etc.

The present invention is particularly suitable for solar power system, and also available for equipments that use solar power such as solar water heater.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A solar tracking system in real time, comprising:
   a light-resistant box, having a loophole provided at a top surface thereof, wherein said light-resistant box comprises a convex lens plane array therein, which is parallel to a bottom surface of said light-resistant box, and a photosensitive element array provided at a bottom of said light-resistant box;
   a microcontroller, connected with said photosensitive element array for obtaining solar a direction angle signal from said photosensitive element array and calculating a solar direction angle;
   a driver, connected with said microcontroller through a data wire, for receiving instructions from said microcontroller;
   a motor, connected with said driver through a conducting wire, and driven by said driver; and
   a solar collection board, connected with said motor mechanically, for adjusting a direction thereof under a driving of said motor and collecting solar;
   wherein an area of said loophole is less than an area of each said convex lens, for increasing a probability that a parallel beam entering into said light-resistant box falls on only one of said convex lens and increasing a tracking accuracy of said real-time solar tracking system.

2. The solar tracking system in real time, as recited in claim 1, wherein said microcontroller has a value of an interval preset therein; when under a working status, said microcontroller obtains a solar direction angle signal from said photosensitive element array at an initial work moment, and adjusts said direction of said solar collection board based on said solar direction angle signal, then, said microcontroller obtains said solar direction angle signal from said photosensitive element array at said interval, and adjusts said direction of said solar collection board based on said solar direction angle signal.

3. The solar tracking system in real time, as recited in claim 1, wherein said photosensitive element array detects a light intensity value, and said microcontroller compares said light intensity value with a light intensity threshold preset therein; when said light intensity value is greater than said light intensity threshold, said microcontroller starts a sunny mode, said microcontroller works normally; when said light intensity value is less than or equal to said light intensity threshold, said microcontroller starts a cloudy mode, said microcontroller stops obtaining said solar direction angle signal from said photosensitive element array.

4. The solar tracking system in real time, as recited in claim 3, wherein under said sunny mode, said microcontroller has a relative threshold $TH_1$ preset therein, said microcontroller compares a real-time value of said solar direction angles $\theta$ with a last value of said solar direction angles $\theta'$; when $|\theta-\theta'| \leq TH_1$, said microcontroller issues an first instruction to said driver based on $\theta$, and said driver drives said motor to change said direction of said solar collection board; when $|\theta-\theta'| > TH_1$, said microcontroller calculates an estimated value of said solar direction angles $\theta_e$ according to $\theta'$ and $TH_1$, and issues an second instruction to said driver based on $\theta_e$, for said driver to drive said motor to change said direction of said solar collection board.

5. The solar tracking system in real time, as recited in claim 3, wherein under said cloudy mode, said microcontroller stops issuing said instruction to said driver, and said solar collection board keeps still.

6. The solar tracking system in real time, as recited in claim 3, wherein said microcontroller calculates an estimated value of said solar direction angles $\theta_e$ according to a parameter of latitude and time, or obtains an estimated value of said solar direction angles $\theta_e$ according to a parameter of time from an estimated table preset therein.

7. The solar tracking system in real time, as recited in claim 6, wherein said light-resistant box is fixedly provided, said light-resistant box has a proper structure in such a manner that said photosensitive element array is able to detect sun's rays with an altitude angle more than 20°.

8. The solar tracking system in real time, as recited in claim 7, wherein under said sunny mode, said microcontroller has an absolute threshold $TH_2$ preset therein, said microcontroller compares a real-time value of said solar direction angles $\theta$ with said estimated value of said solar direction angles $\theta_e$; when $|\theta - \theta_e| \leq TH_2$, said microcontroller issues an instruction to said driver based on $\theta$, and said driver drives said motor to change said direction of said solar collection board; when $|\theta - \theta_e| > TH_2$, said microcontroller issues an instruction to said driver based on $\theta_e$, and said driver drives said motor to change said direction of said solar collection board.

9. The solar tracking system in real time, as recited in claim 7, wherein under said cloudy mode, said microcontroller issues an instruction to said driver based on said estimated value of said solar direction angles $\theta_e$, and said driver drives said motor to change said direction of said solar collection board.

10. A solar tracking system in real time, comprising:
- a light-resistant box, having a loophole provided at a top surface thereof, wherein said light-resistant box comprises a convex lens plane array therein, which is parallel to a bottom surface of said light-resistant box, and a photosensitive element array provided at a bottom of said light-resistant box;
- a microcontroller, connected with said photosensitive element array for obtaining solar a direction angle signal from said photosensitive element array and calculating a solar direction angle;
- a driver, connected with said microcontroller through a data wire, for receiving instructions from said microcontroller;
- a motor, connected with said driver through a conducting wire, and driven by said driver; and
- a solar collection board, connected with said motor mechanically, for adjusting a direction thereof under a driving of said motor and collecting solar;
- wherein an area of said loophole is less than an area of each said convex lens, for increasing a probability that a parallel beam entering into said light-resistant box falls on only one of said convex lens and increasing a tracking accuracy of said real-time solar tracking system;
- wherein said microcontroller has a value of an interval preset therein; when under a working status, said microcontroller obtains a solar direction angle signal from said photosensitive element array at an initial work moment, and adjusts said direction of said solar collection board based on said solar direction angle signal, then, said microcontroller obtains said solar direction angle signal from said photosensitive element array at said interval, and adjusts said direction of said solar collection board based on said solar direction angle signal;
- wherein said photosensitive element array detects a light intensity value, and said microcontroller compares said light intensity value with a light intensity threshold preset therein; when said light intensity value is greater than said light intensity threshold, said microcontroller starts a sunny mode, said microcontroller works normally; when said light intensity value is less than or equal to said light intensity threshold, said microcontroller starts a cloudy mode, said microcontroller stops obtaining said solar direction angle signal from said photosensitive element array;
- wherein under said sunny mode, said microcontroller has a relative threshold $TH_1$ preset therein, said microcontroller compares a real-time value of said solar direction angles $\theta$ with a last value of said solar direction angles $\theta'$; when $|\theta - \theta'| \leq TH_1$, said microcontroller issues an first instruction to said driver based on $\theta$, and said driver drives said motor to change said direction of said solar collection board; when $|\theta - \theta'| > TH_1$, said microcontroller calculates an estimated value of said solar direction angles $\theta_e$ according to $\theta'$ and $TH_1$, and issues an second instruction to said driver based on $\theta_e$, for said driver to drive said motor to change said direction of said solar collection board;
- wherein under said cloudy mode, said microcontroller stops issuing said instruction to said driver, and said solar collection board keeps still;
- wherein said microcontroller calculates an estimated value of said solar direction angles $\theta_e$ according to a parameter of latitude and time, or obtains an estimated value of said solar direction angles $\theta_e$ according to a parameter of time from an estimated table preset therein;
- wherein said light-resistant box is fixedly provided, said light-resistant box has a proper structure in such a manner that said photosensitive element array is able to detect sun's rays with an altitude angle more than 20°;
- wherein under said sunny mode, said microcontroller has an absolute threshold $TH_2$ preset therein, said microcontroller compares a real-time value of said solar direction angles $\theta$ with said estimated value of said solar direction angles $\theta_e$; when $|\theta - \theta_e| \leq TH_2$, said microcontroller issues an instruction to said driver based on $\theta$, and said driver drives said motor to change said direction of said solar collection board; when $|\theta - \theta_e| > TH_2$, said microcontroller issues an instruction to said driver based on $\theta_e$, and said driver drives said motor to change said direction of said solar collection board; and
- wherein under said cloudy mode, said microcontroller issues an instruction to said driver based on said estimated value of said solar direction angles $\theta_e$, and said driver drives said motor to change said direction of said solar collection board.

* * * * *